(12) United States Patent
Kim et al.

(10) Patent No.: US 11,437,293 B2
(45) Date of Patent: Sep. 6, 2022

(54) SEMICONDUCTOR PACKAGES HAVING A DAM STRUCTURE

(71) Applicant: Samsung Electronics Co., Ltd., Suwon-si (KR)

(72) Inventors: Dongho Kim, Asan-si (KR); Jongbo Shim, Asan-si (KR); Hwanpil Park, Hwaseong-si (KR); Jangwoo Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/928,159

(22) Filed: Jul. 14, 2020

(65) Prior Publication Data

US 2021/0242101 A1 Aug. 5, 2021

(30) Foreign Application Priority Data

Feb. 3, 2020 (KR) .......................... 10-2020-0012460

(51) Int. Cl.
*H01L 23/31* (2006.01)
*H01L 25/065* (2006.01)
*H01L 23/00* (2006.01)

(52) U.S. Cl.
CPC .......... *H01L 23/3135* (2013.01); *H01L 24/16* (2013.01); *H01L 24/32* (2013.01); *H01L 24/45* (2013.01); *H01L 25/0657* (2013.01); *H01L 2224/16225* (2013.01); *H01L 2224/32145* (2013.01)

(58) Field of Classification Search
CPC ......................... H01L 23/3135; H01L 25/0657
See application file for complete search history.

(56) References Cited

U.S. PATENT DOCUMENTS

| | | | |
|---|---|---|---|
| 6,803,646 B2 | 10/2004 | Shibue | |
| 6,964,915 B2 | 11/2005 | Farnworth et al. | |
| 7,999,368 B2 | 8/2011 | Yim et al. | |
| 8,039,761 B2 | 10/2011 | Choi et al. | |
| 8,691,626 B2 | 4/2014 | Su et al. | |
| 9,559,030 B2 | 1/2017 | Gocho et al. | |
| 2010/0078791 A1* | 4/2010 | Yim | H01L 25/0655 257/686 |
| 2012/0153462 A1* | 6/2012 | Wakiyama | H01L 23/544 257/737 |

(Continued)

FOREIGN PATENT DOCUMENTS

JP 2002118127 A 4/2002
JP 2009158623 A 7/2009

*Primary Examiner* — Michele Fan
(74) *Attorney, Agent, or Firm* — Muir Patent Law, PLLC

(57) ABSTRACT

A semiconductor package is disclosed. The disclosed semiconductor package includes a substrate having bonding pads at an upper surface thereof, a lower semiconductor chip, at least one upper semiconductor chip disposed on the lower semiconductor chip, and a dam structure having a closed loop shape surrounding the lower semiconductor chip. The dam structure includes narrow and wide dams disposed between the lower semiconductor chip and the bonding pads. The wide dam has a greater inner width than the narrow dam. The semiconductor packages further includes an underfill disposed inside the dam structure and being filled between the substrate and the lower semiconductor chip.

19 Claims, 10 Drawing Sheets

(56) References Cited

U.S. PATENT DOCUMENTS

| | | | |
|---|---|---|---|
| 2014/0160688 A1* | 6/2014 | Lu .......................... | H01L 25/105 |
| | | | 361/728 |
| 2014/0167263 A1* | 6/2014 | Wu ....................... | H01L 21/563 |
| | | | 257/741 |
| 2015/0179614 A1* | 6/2015 | Murai ..................... | H01L 25/50 |
| | | | 257/784 |
| 2021/0082891 A1* | 3/2021 | Cha ................... | H01L 23/49816 |

* cited by examiner

SEMICONDUCTOR PACKAGES HAVING A DAM STRUCTURE

CROSS-REFERENCE TO THE RELATED APPLICATION

This application claims the benefit of priority under 35 U.S.C. § 119 from Korean Patent Application No. 10-2020-0012460, filed on Feb. 3, 2020, in the Korean Intellectual Property Office, the disclosure of which is incorporated herein by reference in its entirety.

BACKGROUND

1. Field

The example embodiments of the disclosure relate to a semiconductor package having a dam structure.

2. Description of the Related Art

To cope with a tendency of semiconductor devices toward miniaturization, a technology for mounting semiconductor chips having individual functions in a single semiconductor package is required. Such a semiconductor package includes an underfill configured to be filled between a substrate and a lower semiconductor chip, and a dam structure configured to prevent bonding pads from being covered by the underfill. In the case in which the size of the semiconductor package is reduced, there may be a problem in that a dispensing area of the underfill may be narrowed.

SUMMARY

The example embodiments of the disclosure provide a semiconductor package including a dam structure having a narrow dam and a wide dam.

According to some example embodiments, a semiconductor package may include a substrate having bonding pads at an upper surface thereof, a lower semiconductor chip disposed on the substrate and at least one upper semiconductor chip disposed on the lower semiconductor chip, a dam structure disposed on the substrate and having a closed loop shape surrounding the lower semiconductor chip, the dam structure including narrow and wide dams, the narrow dam being disposed between the lower semiconductor chip and the bonding pads, and the wide dam having a greater inner width than the narrow dam, and an underfill disposed inside the dam structure and being filled between the substrate and the lower semiconductor chip.

According to some example embodiments, a semiconductor package may include a substrate having bonding pads at an upper surface thereof, a lower semiconductor chip disposed on the substrate and at least one upper semiconductor chip disposed on the lower semiconductor chip, an underfill filled between the substrate and the lower semiconductor chip, the underfill including a non-extension portion disposed between the lower semiconductor chip and the bonding pads, and an extension portion having a greater width than the non-extension portion, and a dam structure disposed on the substrate and having a closed loop shape surrounding the underfill.

According to some example embodiments, a semiconductor package may include a substrate having bonding pads at an upper surface thereof, a lower semiconductor chip mounted on the substrate by flip-chip bonding and an upper semiconductor chip mounted on the lower semiconductor chip by wire bonding, an external connection terminal disposed beneath the substrate, a dam structure disposed on the substrate and having a closed loop shape surrounding the lower semiconductor chip, the dam structure including narrow and wide dams, the narrow dam being disposed between the lower semiconductor chip and the bonding pads, and the wide dam having a greater inner width than the narrow dam, an underfill disposed inside the dam structure and being filled between the substrate and the lower semiconductor chip, and an encapsulant covering the substrate, the lower semiconductor chip, and the upper semiconductor chip.

BRIEF DESCRIPTION OF THE DRAWINGS

The above and other objects, features, and advantages of inventive concepts will become more apparent to those of ordinary skill in the art by describing example embodiments thereof in detail with reference to the accompanying drawings, in which like numbers refer to like elements throughout. In the drawings.

DETAILED DESCRIPTION OF EXAMPLE EMBODIMENTS

Figure 1:
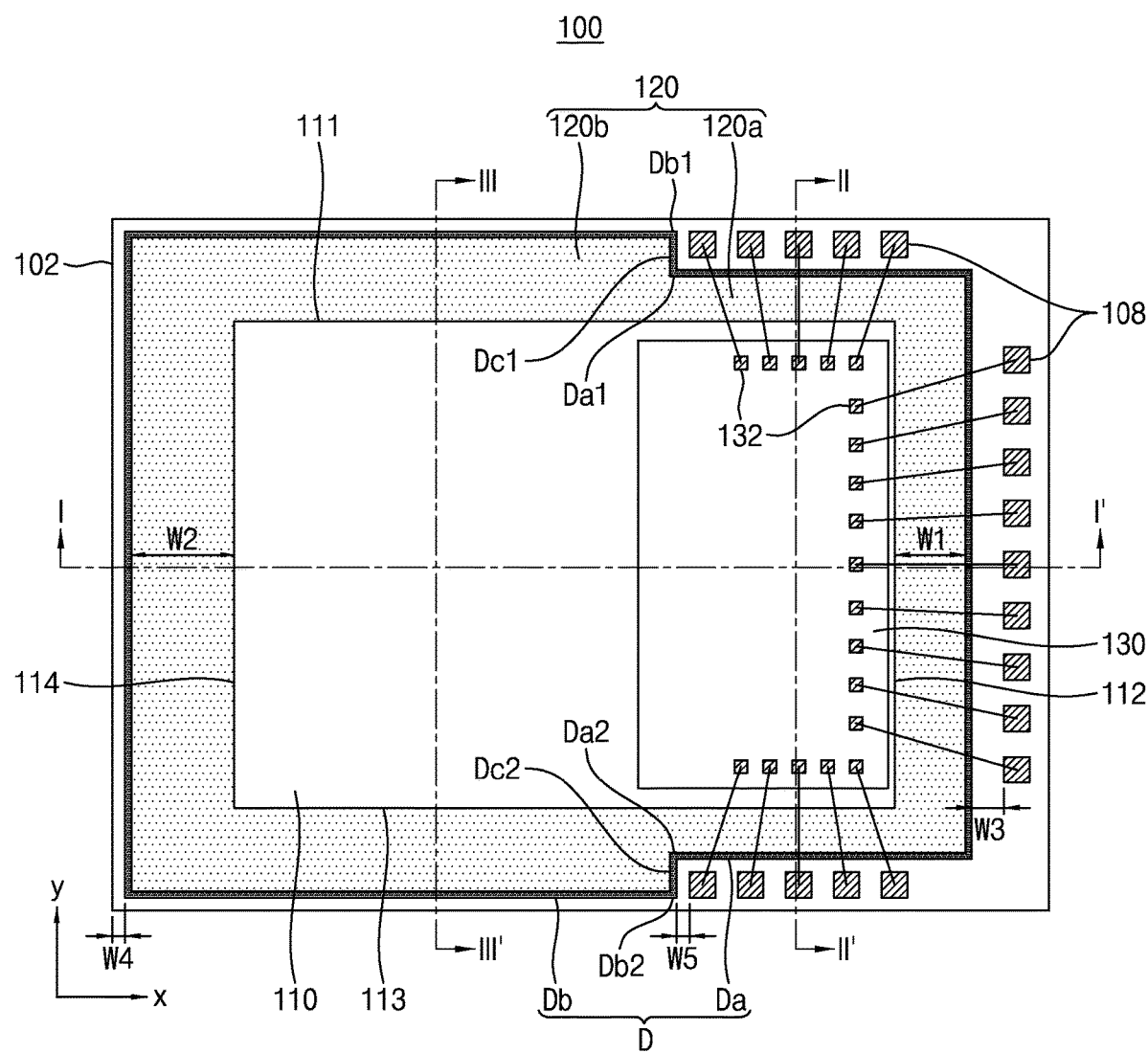
FIG. 1 is a plan view of a semiconductor package, according to an example embodiment of the inventive concepts.

FIG. 1 is a plan view of a semiconductor package, according to an example embodiment of the inventive concepts.

Figure 2A:
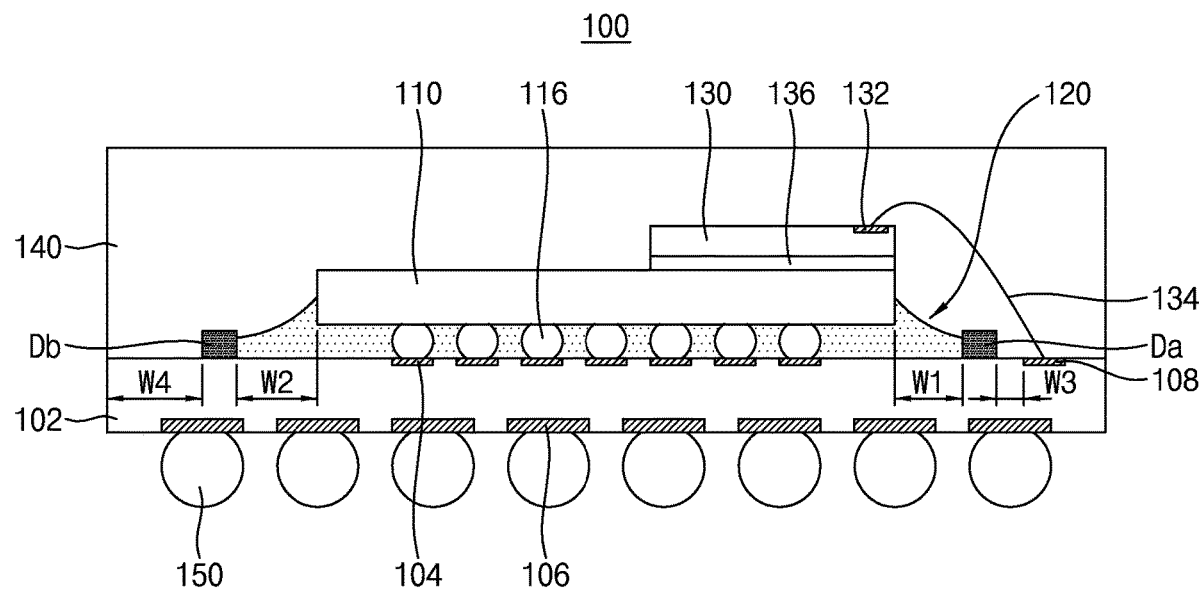
FIG. 2A to 2C are vertical cross-sectional views of the semiconductor package shown in FIG. 1, respectively taken along lines I-I', II-II', and III-III'.
Figure 2B:
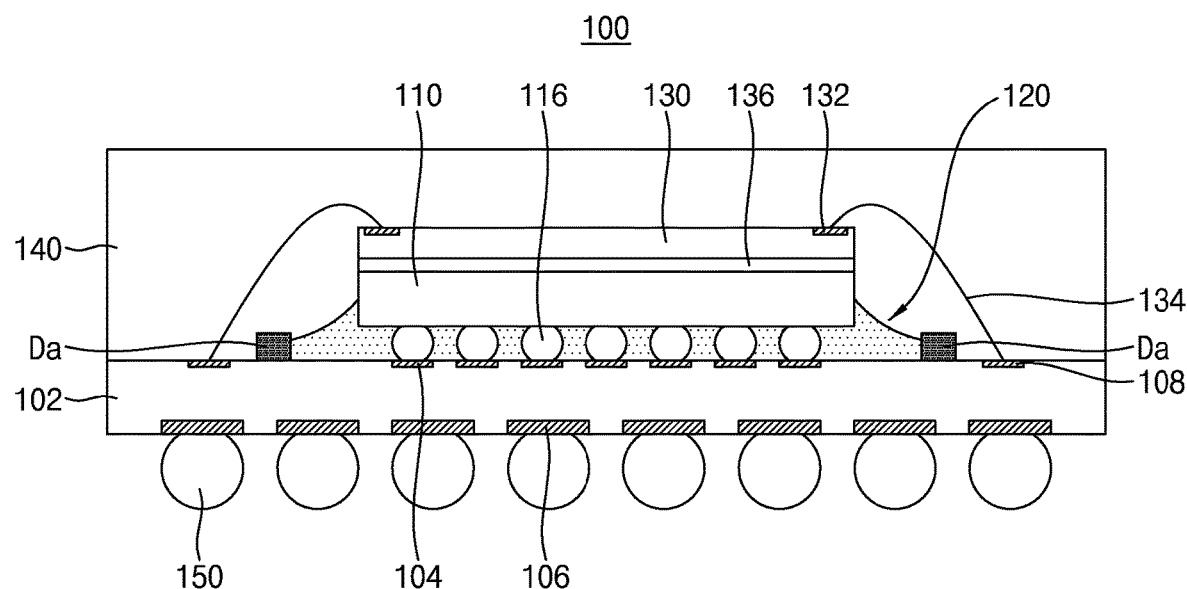
Figure 2C:
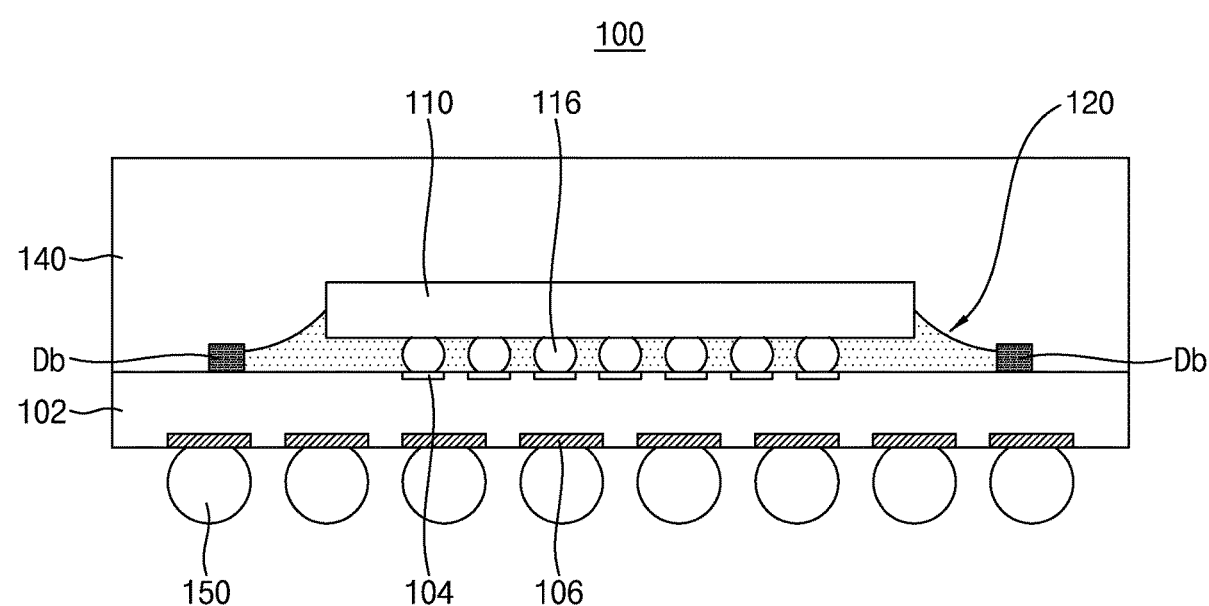

FIG. 2A to 2C are vertical cross-sectional views of the semiconductor package shown in FIG. 1, respectively taken along lines I-I', II-II', and III-III'.

Referring to FIG. 1 and FIGS. 2A to 2C, a semiconductor package, which is designated by reference numeral "100", may include a substrate 102, a dam structure D, a lower semiconductor chip 110, an underfill 120, an upper semiconductor chip 130, an encapsulant 140, and external connection terminals 150.

The substrate 102 may include upper pads 104 disposed at an upper surface of the substrate 102. The substrate 102 may also include lower pads 106 disposed at a lower surface of the substrate 102. The upper pads 104 may be electrically connected to corresponding ones of the lower pads 106, respectively. In addition, the substrate 102 may include bonding pads 108 disposed at the upper surface of the substrate 102. Upper surfaces of the bonding pads 108 may be coplanar with the upper surface of the substrate 102. The bonding pads 108 may be electrically connected to corresponding ones of the lower pads 106, respectively. The bonding pads 108 may be disposed at three sides of the substrate 102. For example, the bonding pads 108 may be disposed at one lateral edge of the substrate 102 extending in a first horizontal direction x and opposite lateral edges of the substrate 102 extending in a second horizontal direction y, when viewed in a plan view, but embodiments of the disclosure are not limited thereto. Although the bonding pads 108 are illustrated as having a rectangular shape, in some example embodiments, the bonding pads 108 may have a circular shape, an oval shape, or other shapes.

The lower semiconductor chip 110 may be disposed on the substrate 102. The lower semiconductor chip 110 may have a rectangular shape and, as such, may have a first side surface 111, a second side surface 112, a third side surface 113, and a fourth side surface 114. The lower semiconductor chip 110 may include bumps 116 disposed at a lower surface of the lower semiconductor chip 110. Each bump 116 may contact the upper surface of a corresponding one of the upper pads 104. The bumps 116 may be electrically connected to the substrate 102 via the upper pads 104, respectively.

The dam structure D may be disposed at the upper surface of the substrate 102 and may surround the lower semiconductor chip 110. For example, the dam structure D may extend around the first side surface 111, the second side surface 112, the third side surface 113, and the fourth side surface 114 of the substrate 102. The dam structure D may include a narrow dam Da, a wide dam Db, a first connector Dc1, and a second connector Dc2. The narrow dam Da may be disposed between the bonding pads 108 and the lower semiconductor chip 110. The narrow dam Da may have a relatively small inner width in the second horizontal direction y. The wide dam Db may be connected to the narrow dam Da and may have a relatively large inner width in the second horizontal direction y. In an example embodiment, the distance between the lower semiconductor chip 110 and the wide dam Db may be greater than the distance between the lower semiconductor chip 110 and the narrow dam Da. For example, the distance between the lower semiconductor chip 110 and the narrow dam Da, that is, a distance W1, may be 200 to 400 μm, and the distance between the lower semiconductor chip 110 and the wide dam Db, that is, a distance W2, may be 500 to 1,000 μm. The distance between the segment of the narrow dam Da that extends lengthwise in the second horizontal direction y and the bonding pads 108 adjacent thereto in the first horizontal direction x, that is, a distance W3, may be 50 to 150 μm. In addition, a distance between the segments of the narrow dam Da that extend lengthwise in the first horizontal direction x and the bonding pads 108 adjacent thereto in the second horizontal direction y may be 50 to 150 μm. The distance between the wide dam Db and each of the first side surface 111, the third side surface 113, and the fourth side surface 114 of the substrate 102, that is, a distance W4, may be 100 to 300 μm. The distance between each of the first and second connectors Dc1 and Dc2 and the bonding pad 108 disposed adjacent thereto in the first horizontal direction x, that is, a distance W5, may be 50 to 150 μm.

The dam structure D may spatially separate the bonding pads 108 and the underfill 120 from each other, forming a barrier between the bonding pads 108 and the underfill 120. For example, the narrow dam Da of the dam structure D may extend along the first to third side surfaces 111, 112, and 113 of the lower semiconductor chip 110 between the bonding pads 108 and the underfill 120.

In an example embodiment, each of the narrow dam Da and the wide dam Db may comprise linear segments that form a ⊏-shape or an angular C-shape. For example, the narrow dam Da may include three segments that are adjacent to and surround the first to third side surfaces 111, 112, and 113 of the lower semiconductor chip 110, and the wide dam Db may include three segments that are adjacent to and surround the first, third, and fourth side surfaces 111, 113, and 114 of the lower semiconductor chip 110. Each of the linear segments of the narrow dam Da may be positioned between a corresponding side surface of the lower semiconductor chip 110 and the bonding pads 108 adjacent thereto. When viewed in a plan view, the narrow dam Da and the wide dam Db may include a first end Da1 and a first end Db1, which are disposed adjacent to the first side surface 111 of the lower semiconductor chip 110, respectively, and a second end Da2 and a second end Db2, which are disposed adjacent to the third side surface 113 of the lower semiconductor chip 110, respectively. The first connector Dc1 may connect the first end Da1 and the first end Db1. The second connector Dc2 may connect the second end Da2 and the second end Db2. In some example embodiments, each of the narrow dam Da and the wide dam Db may have a round C-shape or an arc shape. The distance W5 between each of the first and second connectors Dc1 and Dc2 and the bonding pad 108 disposed adjacent thereto in the first horizontal direction x may be 50 to 150 μm. The bonding pads 108 may be disposed to face corresponding ones of the first to third side surfaces 111, 112, and 113 of the lower semiconductor chip 110.

The underfill 120 may be filled between the substrate 102 and the lower semiconductor chip 110. The underfill 120 may include an epoxy resin. The underfill 120 may protect the bumps 116. The underfill 120 may partially cover the upper surface of the substrate 102, and may not cover the bonding pads 108. The underfill 120 may be disposed inside the dam structure D, and may contact an inner surface of the dam structure D. For example, the underfill 120 may be disposed within a perimeter formed by the dam structure D.

When viewed in a plan view, the underfill 120 may include a non-extension portion 120a filling an area inside the narrow dam Da, and an extension portion 120b filling an area inside the wide dam Db. The non-extension portion 120a may be disposed between the bonding pads 108 and the lower semiconductor chip 110. The extension portion 120b may be connected to the non-extension portion 120a. The extension portion 120b may have a greater width in the second horizontal direction y than the non-extension portion 120a in the second horizontal direction y. For example, the distance between the lower semiconductor chip 110 and a side surface of the extension portion 120b in the second horizontal direction y (e.g., the side surface of the extension portion 120b that contacts an inner surface of the wide dam Db) may be greater than the distance between the lower semiconductor chip 110 and a side surface of the non-extension portion 120a in the second horizontal direction y (e.g., the side surface of the non-extension portion 120a that contacts an inner surface of the narrow dam Da). Although each of the non-extension portion 120a and the extension portion 120b is illustrated as having a rectangular shape, each of the non-extension portion 120a and the extension portion 120b may have a circular shape or an oval shape without being limited thereto.

The amount of the underfill 120 filled between the substrate 102 and the lower semiconductor chip 110 may be dependent on the height of the bumps 116. However, when the size of the semiconductor package 100 is reduced, the dispensing area of the underfill 120 may be insufficient. Since the semiconductor package 100 according to the example embodiment of the inventive concepts includes the dam structure D having the narrow dam Da and the wide dam Db, it may be possible to secure a relatively wide dispensing area of the underfill 120 for a given size of the semiconductor package 100.

The upper semiconductor chip 130 may be disposed on the lower semiconductor chip 110. In an example embodiment, the upper semiconductor chip 130 may be mounted on the substrate 102 by wire bonding. For example, the upper semiconductor chip 130 may include chip pads 132 disposed on an upper surface of the upper semiconductor chip 130. The bonding pads 108 of the substrate 102 and the chip pads 132 of the upper semiconductor chip 130 may be electrically connected by bonding wires 134, respectively. The upper semiconductor chip 130 may be fixed to an upper surface of the lower semiconductor chip 110 by an adhesive 136.

The lower semiconductor chip 110 may include an application processor (AP) such as a microprocessor or a microcontroller, or a logic chip such as a central processing unit (CPU), a graphics processing unit (GPU), a modem, an application-specific integrated circuit (ASIC) or a field programmable gate array (FPGA). The upper semiconductor chip 130 may include a volatile memory such as dynamic random access memory (DRAM) or a non-volatile memory such as a flash memory. In an example embodiment, the lower semiconductor chip 110 may include a modem chip, and the upper semiconductor chip 130 may include a DRAM chip.

The encapsulant 140 may cover the substrate 102, the lower semiconductor chip 110, the upper semiconductor chip 130, and the dam structure D. In some embodiments, the encapsulant 140 may cover an upper surface of the underfill 120 between the lower semiconductor chip 110 and the dam structure D. In an example embodiment, the encapsulant 140 may include an epoxy molding compound (EMC).

The external connection terminals 150 may be formed at the lower surface of the substrate 102. The external connection terminals 150 may be connected to the lower pads 106 of the substrate 102, respectively, and, as such, may be electrically connected to the upper pads 104 via the lower pads 106, respectively.

Figure 3:
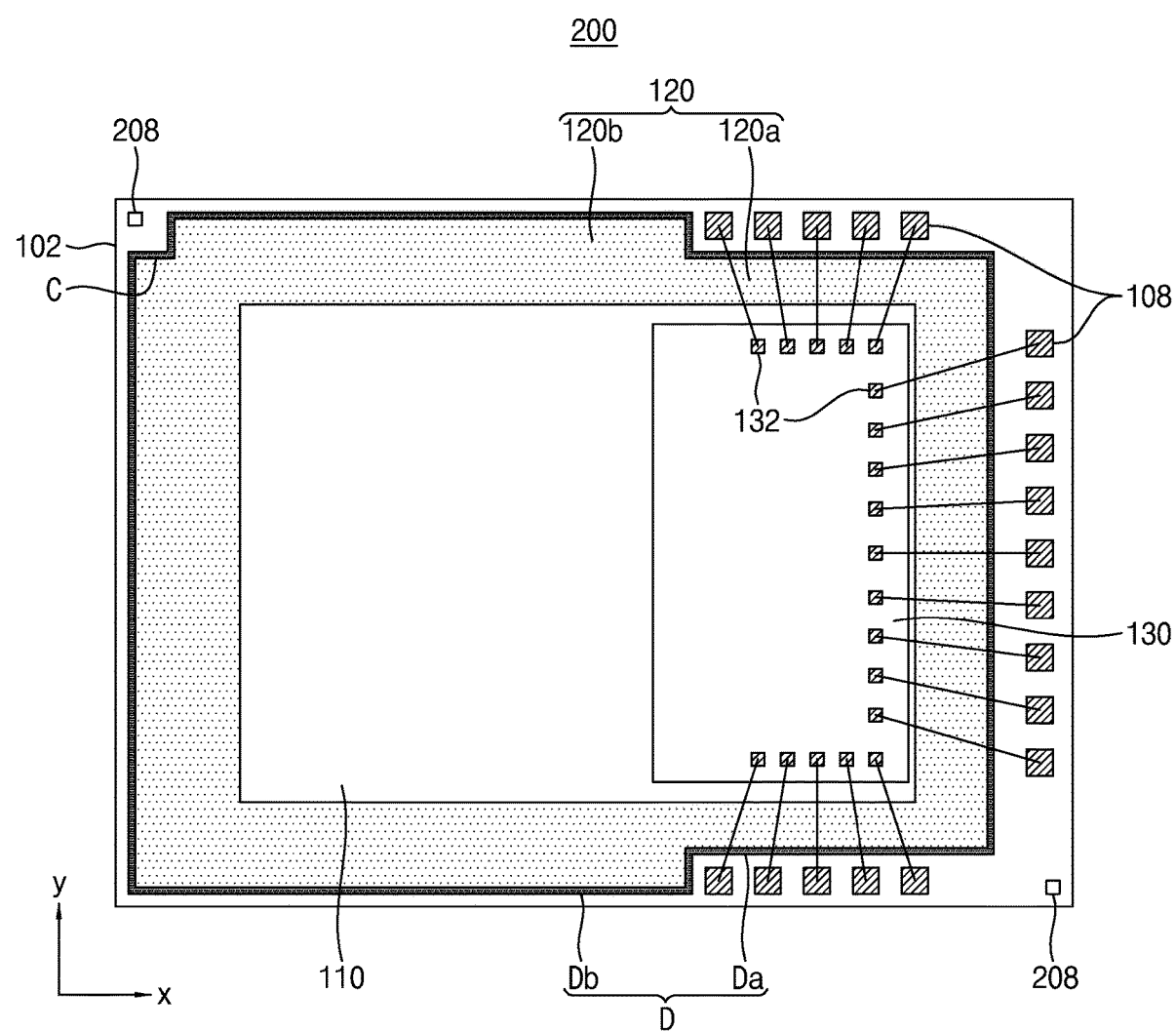
FIG. 3 is a plan view of a semiconductor package, according to an example embodiment of the inventive concepts.

FIG. 3 is a plan view of a semiconductor package, according to an example embodiment of the inventive concepts.

Referring to FIG. 3, a semiconductor package, which is designated by reference numeral "200", may include a dam structure D disposed on a substrate 102 and surrounding a lower semiconductor chip 110. The semiconductor package 200 may include alignment marks 208 disposed on the substrate 102. The alignment marks 208 may serve as a reference for alignment of an upper semiconductor chip 130 on the substrate 102 and connection of the upper semiconductor chip 130 to bonding pads 108 upon disposition of the upper semiconductor chip 130. The alignment marks 208 may be disposed at an edge of the substrate 102. For example, two alignment marks 208 may be disposed at two corners of the substrate 102 opposite to each other in a diagonal direction, respectively.

The dam structure D may not overlap with the alignment marks 208. For example, the dam structure D may include a cutout C bent at a right angle to face a corresponding one of the alignment marks 208. The cut-out C may be disposed to be spaced apart from the corresponding alignment mark 208. As such, the alignment marks 208 may be disposed outside the dam structure D.

Figure 4:
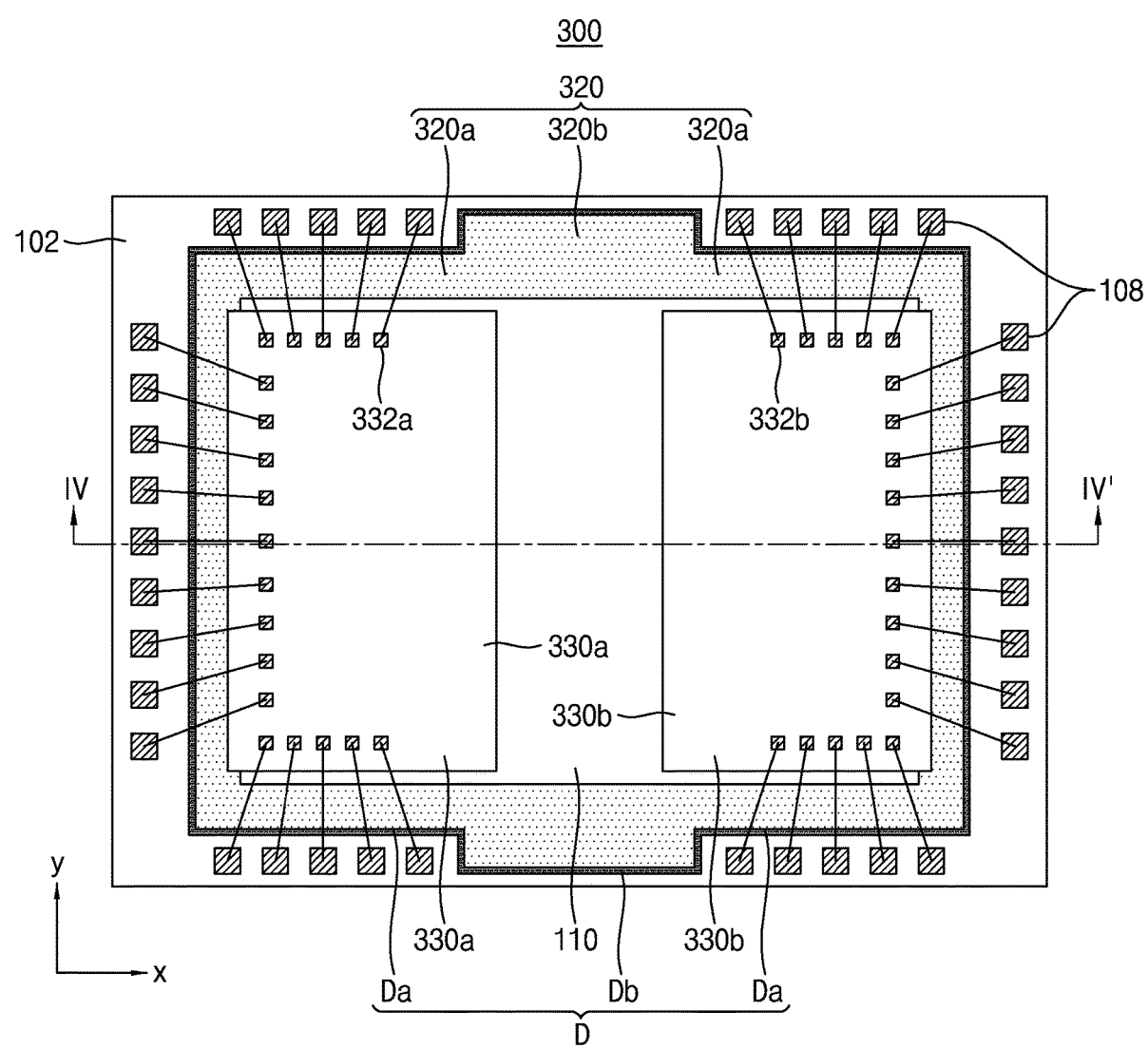
FIG. 4 is a plan view of a semiconductor package, according to an example embodiment of the inventive concepts.

FIG. 4 is a plan view of a semiconductor package, according to an example embodiment of the inventive concepts.

Figure 5:
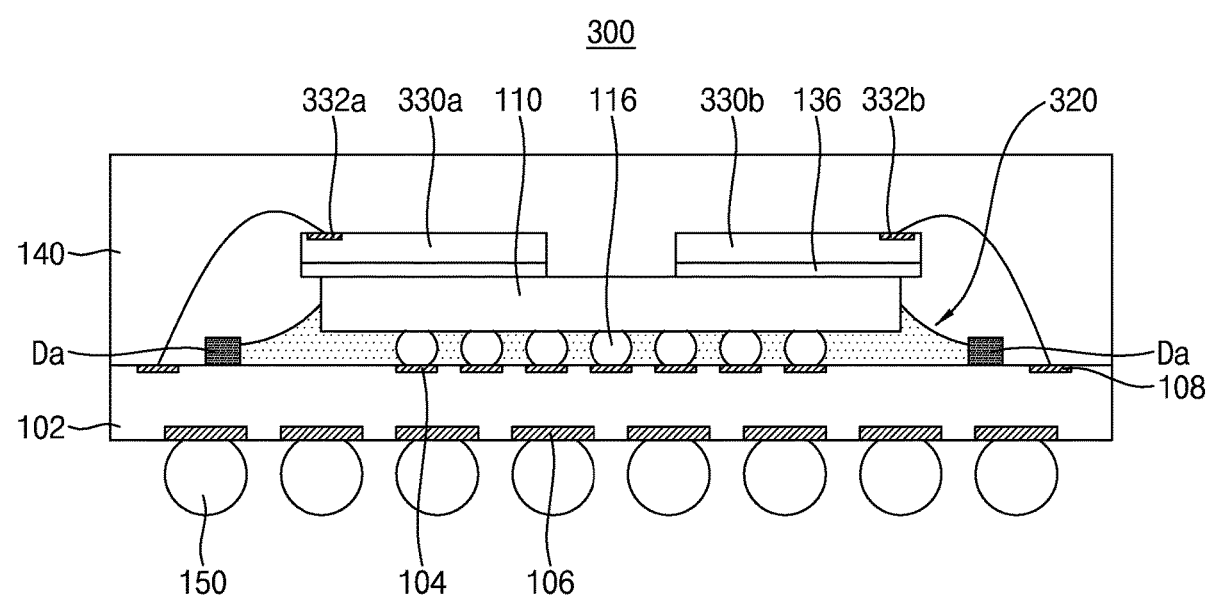
FIG. 5 is a vertical cross-sectional view of the semiconductor package shown in FIG. 4, taken along line IV-IV'.

FIG. 5 is a vertical cross-sectional view of the semiconductor package shown in FIG. 4, taken along line IV-IV'.

Referring to FIGS. 4 and 5, a semiconductor package, which is designated by reference numeral "300", may include a dam structure D surrounding a lower semiconductor chip 110, and an underfill 320 disposed inside the dam structure D. A first upper semiconductor chip 330a and a second upper semiconductor chip 330b may be disposed on the lower semiconductor chip 110. The first upper semiconductor chip 330a and the second upper semiconductor chip 330b may be disposed to be spaced apart from each other in a first horizontal direction x. In an example embodiment, the first upper semiconductor chip 330a and the second upper semiconductor chip 330b may be mounted on a substrate 102 by wire bonding. The first upper semiconductor chip 330a may include first chip pads 332a disposed at an upper surface of the first upper semiconductor chip 330a. The second upper semiconductor chip 330b may include second chip pads 332b disposed at an upper surface of the second upper semiconductor chip 330b. The first chip pads 332a may be disposed to form a ⊏-shape. For example, the first chip pads 332a may be disposed at upper, lower, and left sides of the first upper semiconductor chip 330a, and not disposed on a right side of the first upper semiconductor chip 330a. The second chip pads 332b may be disposed to form a ⊐-shape. For example, the second chip pads 332b may be disposed at upper, lower, and right sides of the second upper semiconductor chip 330b, and not disposed on a left side of the second upper semiconductor chip 330b. The bonding pads 108 may be disposed to surround the lower semiconductor chip 110 such that the bonding pads 108 correspond to the first chip pads 332a and the second chip pads 332b, respectively.

The dam structure D may include a narrow dam Da and a wide dam Db. For example, the dam structure D may include two narrow dams Da spaced apart from each other in the first horizontal direction x, and two wide dams Db disposed between the narrow dams Da and extending in the second horizontal direction y. A width in the first horizontal direction x of the wide dams Db may be greater than the distance between the first upper semiconductor chip 330a and the second upper semiconductor chip 330b. The narrow dams Da may extend between the bonding pads 108 and the lower semiconductor chip 110. The dam structure D may surround the lower semiconductor chip 110, and may have a closed loop shape.

The underfill 320 may be disposed inside the dam structure D, and may contact an inner surface of the dam structure D. When viewed in a plan view, the underfill 320 may include non-extension portions 320a respectively filling areas inside the narrow dams Da, and extension portions 320b respectively filling areas inside the wide dams Db. The extension portions 320b may have a greater width than the non-extension portions 320a. For example, the width of the extension portions 320b between a side surface of the lower semiconductor chip 120 and an inner surface of the wide dam Db in the second horizontal direction y may be greater than the width of the non-extension portions 320a between a side surface of the lower semiconductor chip 120 an inner surface of the narrow dam Da in the second horizontal direction y.

Figure 6:
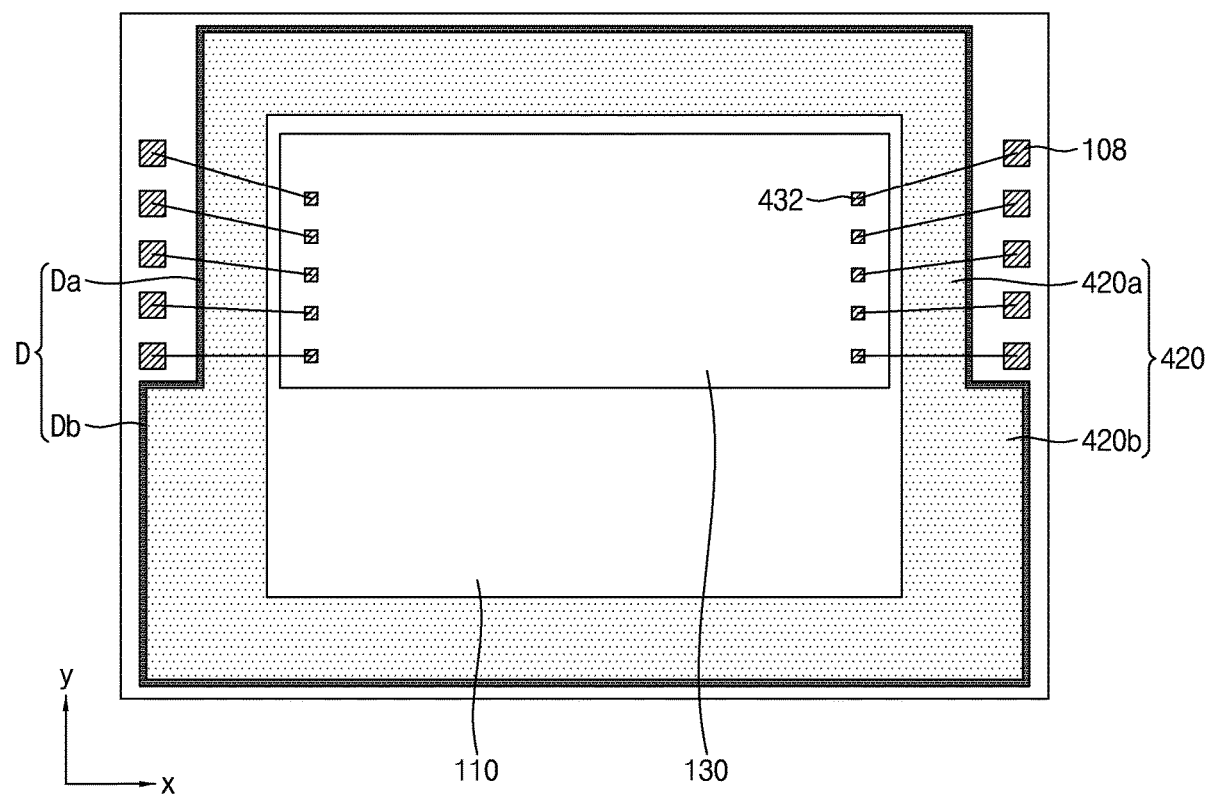
FIG. 6 is a plan view of a semiconductor package, according to an example embodiment of the inventive concepts.

FIG. 6 is a plan view of a semiconductor package according to an example embodiment of inventive concepts.

Referring to FIG. 6, a semiconductor package 400 may include a dam structure D surrounding a lower semiconductor chip 110, and an underfill 420 disposed inside the dam structure D. An upper semiconductor chip 130 may include chip pads 432 disposed at an upper surface of the upper semiconductor chip 130. The chip pads 432 may be disposed at left and right edges of the upper semiconductor chip 130. Bonding pads 108 may be disposed at left and right edges of a substrate 102 while corresponding to the chip pads 432, respectively.

The dam structure D may include a narrow dam Da and a wide dam Db. For example, when viewed in a plan view, the dam structure D may include a narrow dam Da, and a wide dam Db disposed beneath the narrow dam Da. The narrow dam Da may have an internal width that is narrower in the first horizontal direction x than an internal width of the wide dam Db in the first horizontal direction x. The narrow dam Da may extend between the bonding pads 108 and the lower semiconductor chip 110. The dam structure D may surround the lower semiconductor chip 110, and may have a closed loop shape.

When viewed in a plan view, the underfill 420 may include a non-extension portion 420a filling an area inside the narrow dam Da, and an extension portion 420b filling an area inside the wide dam Db.

Figure 7:
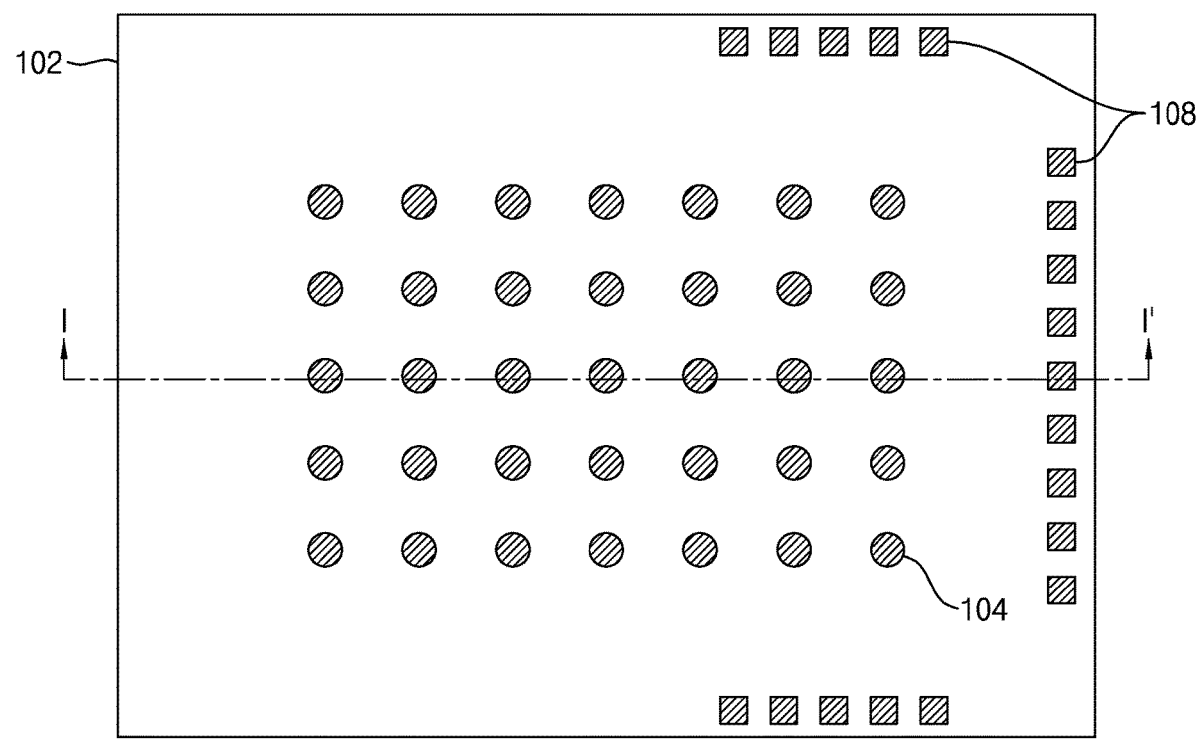
FIG. 7 to 12 are plan views and vertical cross-sectional views illustrating in a process order a method of manufacturing a semiconductor package, according to an example embodiment of the inventive concepts.
Figure 8:
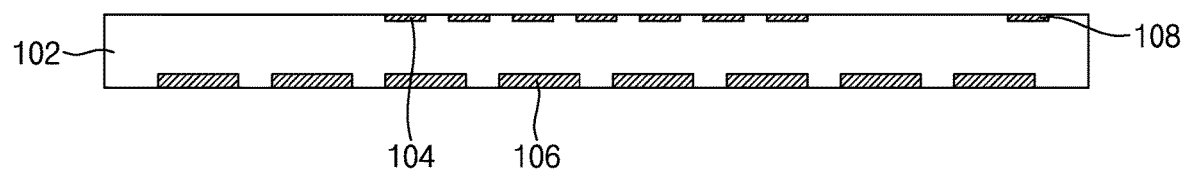
Figure 9:
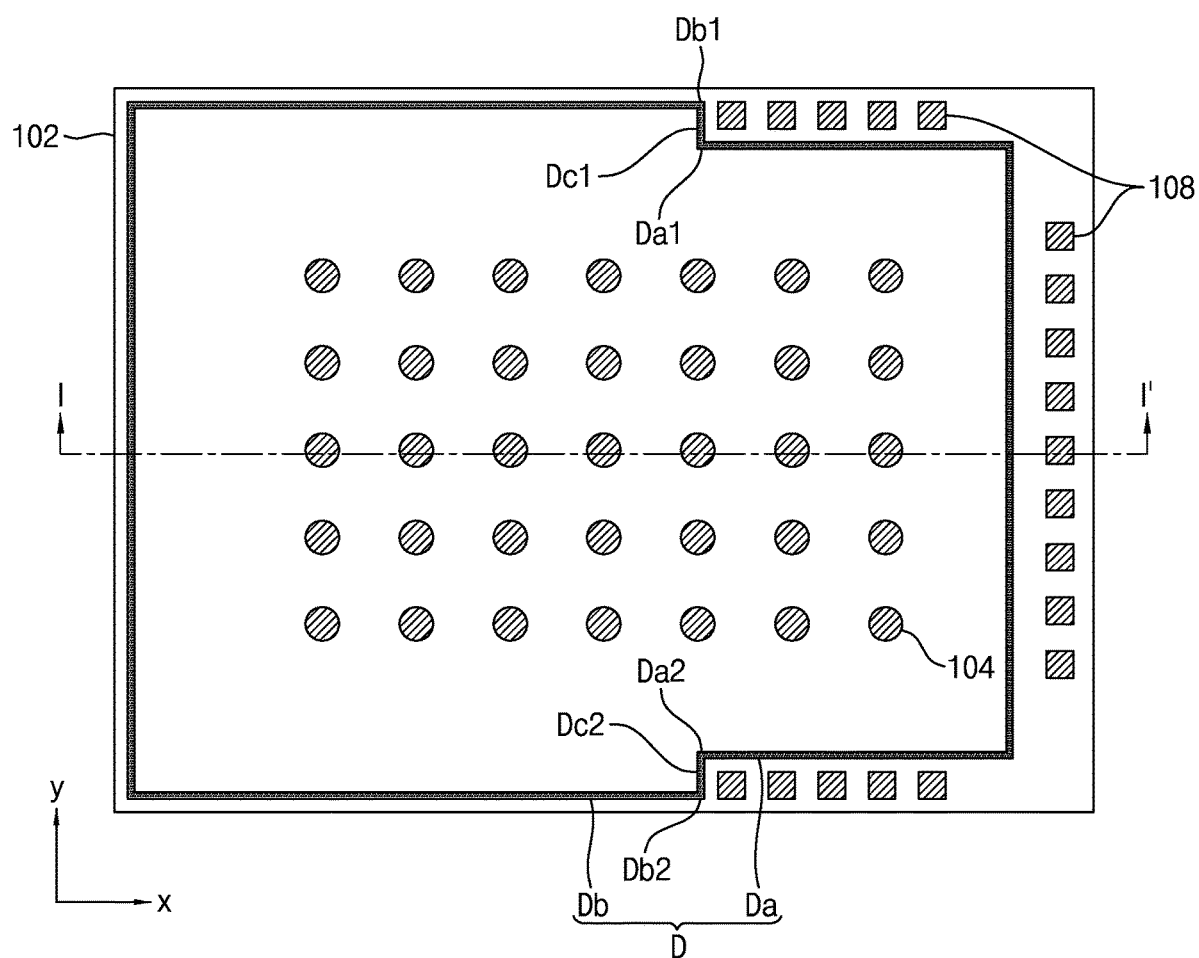
Figure 10:
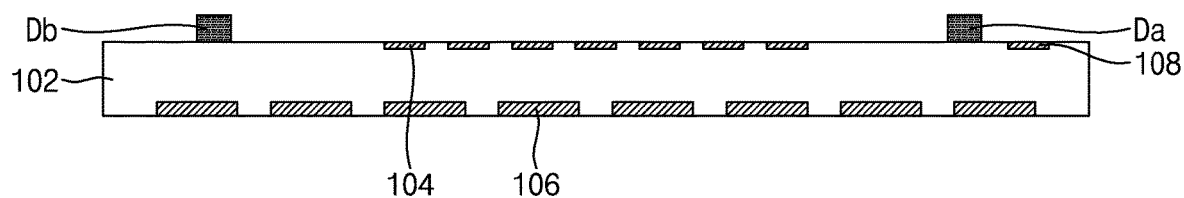
Figure 11:
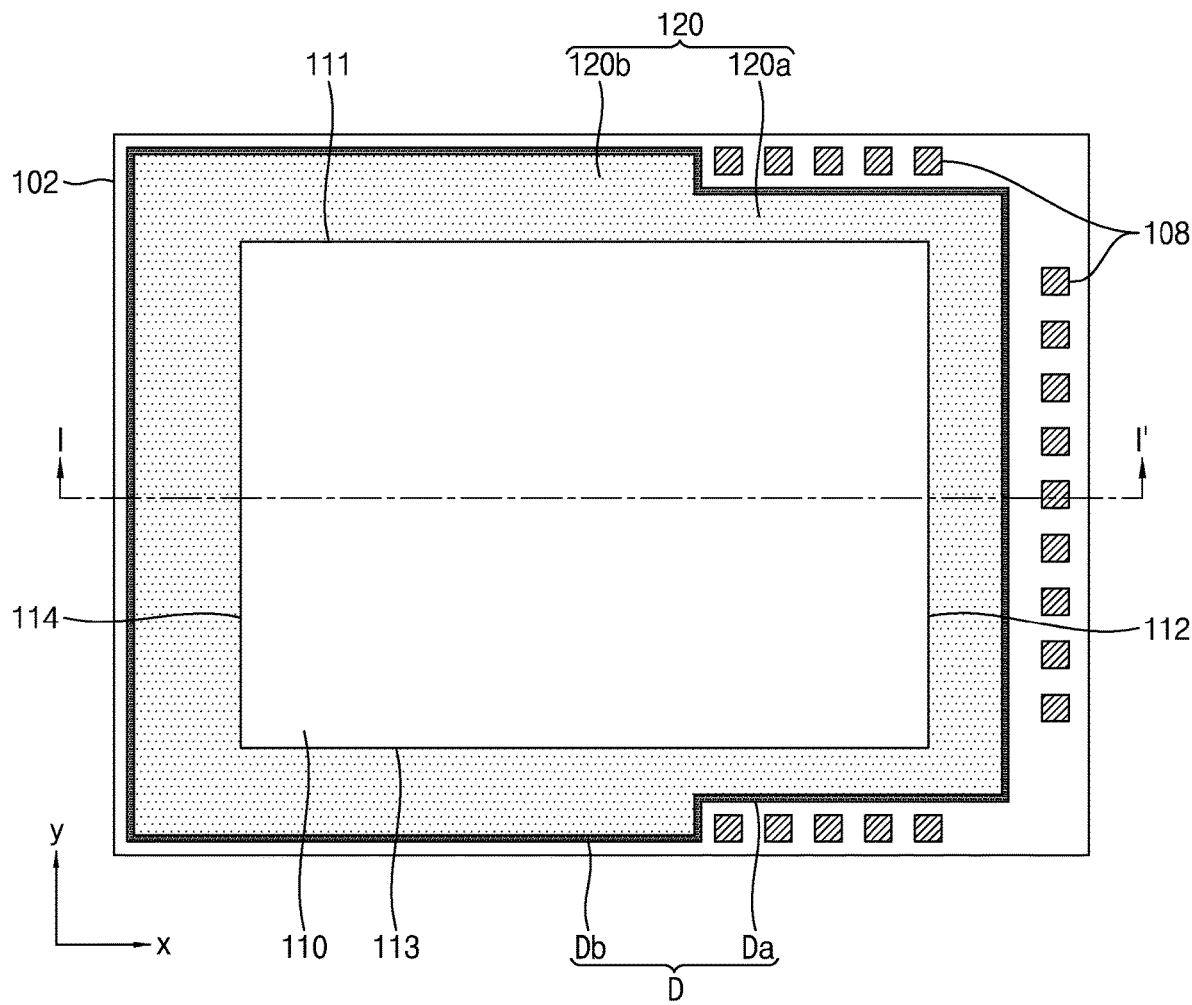
Figure 12:
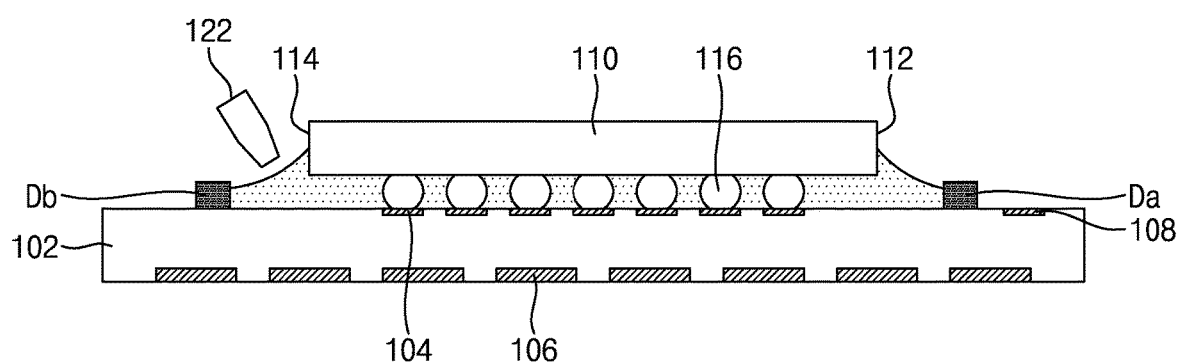

FIGS. 7 to 12 are plan views and vertical cross-sectional views illustrating a process order of a method of manufacturing a semiconductor package, according to an example embodiment of the inventive concepts. FIGS. 7, 9, and 11 are plan views explaining the method for manufacturing the semiconductor package 100. FIGS. 8, 10, and 12 are cross-sectional views taken along line I-I' in FIGS. 7, 9, and 11, respectively.

Referring to FIGS. 7 and 8, a substrate 102 may be provided. The substrate 102 may include upper pads 104 disposed at the upper surface of the substrate 102. The substrate 102 may include lower pads 106 disposed at the lower surface of the substrate 102. The upper pads 104 may be electrically connected to corresponding ones of the lower pads 106, respectively. In addition, the substrate 102 may include bonding pads 108 disposed at the upper surface of the substrate 102. The upper pads 104, the lower pads 106, and the bonding pads 108 may include metal such as Al, Ti, Cr, Fe, Co, Ni, Cu, Zn, Pd, Pt, Au and Ag.

Referring to FIGS. 9 and 10, a dam structure D may be formed at the upper surface of the substrate 102. A lower surface of the dam structure D may contact the upper surface of the substrate 102. The dam structure D may include a photoresist resin or metal such as Al or Cu. In an example embodiment, the dam structure D may include a photoresist resin. The photoresist resin may include an epoxy resin, an acrylic monomer, a phosphine oxide compound, an amine compound, silica, barium sulfate, or the like.

The dam structure D may be formed by forming a photoresist resin layer over the upper surface of the substrate 102, and then etching the photoresist resin layer. The dam structure D may have an upper surface that is planar and parallel to the upper surface of the substrate 102, and side surfaces that are planar and perpendicular to the upper surface of the substrate 102. In an example embodiment, the dam structure D may have a height of 18 μm or less. As used herein, height may refer to the thickness of height measured in a direction perpendicular to the upper surface of the substrate 102. The height of the dam structure D may be equal to or less than a distance between the upper surface of the substrate 102 and a lower surface of the lower semiconductor chip 110. The dam structure D may be disposed to surround the upper pads 104, and may have a closed loop shape. The upper pads 104 may be disposed inside the closed loop of the dam structure D, whereas the bonding pads 108 may be disposed outside the closed loop of the dam structure D. The dam structure D may include a narrow dam Da, a wide dam Db, and a first connector Dc1 and a second connector Dc2, which connect the narrow dam Da and the wide dam Db. For example, each of the narrow dam Da and the wide dam Db may have a ⊏-shape or an angular C-shape. A first end Da1 of the narrow dam Da may be connected to a first end Db1 of the wide dam Db by the first connector Dc1. A second end Da2 of the narrow dam Da may be connected to a second end Db2 of the wide dam Db by the second connector Dc2. In some embodiments, each of the first connector Dc1 and the second connector Dc2 may be perpendicular to the segments of the narrow dam Da and the wide dam Db to which they are connected. In an example embodiment, the distance between the narrow dam Da and the corresponding side surface of the substrate 102 may be greater than the distance between the wide dam Db and the corresponding side surface of the substrate 102.

Referring to FIGS. 11 and 12, a lower semiconductor chip 110 may be mounted on the substrate 102. In addition, an underfill 120 may be formed. The lower semiconductor chip 110 may be mounted on the substrate 102 by flip-chip bonding. The lower semiconductor chip 110 may have a rectangular shape and, as such, may have a first side surface 111, a second side surface 112, a third side surface 113, and a fourth side surface 114. The lower semiconductor chip 110 may include the bumps 116 disposed at the lower surface of the lower semiconductor chip 110 while being connected to the upper pads 104, respectively.

After mounting of the lower semiconductor chip 110, the underfill 120 may be formed to be filled between the substrate 102 and the lower semiconductor chip 110. In an example embodiment, the underfill 120 may include an epoxy resin. The underfill 120 may be formed inside the dam structure D, and may not cover the bonding pads 108. The underfill 120 may be formed using a dispensing method. For example, the underfill 120 may be supplied from a dispenser 122 to an area between the fourth side surface 114 of the lower semiconductor chip 110 and the dam structure D. The underfill 120 may be filled between the substrate 102 and the lower semiconductor chip 110 while flowing from the fourth side surface 114 toward the second side surface 112.

Referring back to FIG. 1 and FIGS. 2A to 2C, an upper semiconductor chip 130 may be disposed on the lower semiconductor chip 110. The upper semiconductor chip 130 may be mounted on the substrate 102 by wire bonding. For example, chip pads 132 of the upper semiconductor chip 130 may be connected to the bonding pads 108 by bonding wires 134, respectively. The upper semiconductor chip 130 may be fixed to the upper surface of the lower semiconductor chip 110 by an adhesive 136. The adhesive 136 may include a die attach film (DAF) or an epoxy resin.

An encapsulant 140 may be formed to cover the substrate 102, the lower semiconductor chip 110, the upper semiconductor chip 130, and the dam structure D. The encapsulant 140 may be a resin including epoxy, polyimide, or the like. For example, the encapsulant 140 may include a bisphenol-group epoxy resin, a polycyclic aromatic epoxy resin, an o-cresol novolac epoxy resin, a biphenyl-group epoxy resin, a naphthalene-ground epoxy resin, or the like.

In accordance with the example embodiments of the disclosure, it may be possible to secure a wide dispensing area of an underfill through a configuration in which a dam structure includes a narrow dam and a wide dam.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
a substrate having bonding pads at an upper surface thereof;
a lower semiconductor chip disposed on the substrate and at least one upper semiconductor chip attached to an adhesive in contact with an upper surface of the lower semiconductor chip;
a dam structure disposed on the substrate and having a single closed loop shape surrounding the lower semiconductor chip, the dam structure including narrow and wide dams connected to one another to form the single closed loop shape, the narrow dam being disposed between the lower semiconductor chip and the bonding pads, and the wide dam having a greater inner width than the narrow dam; and
an underfill disposed inside the dam structure and being filled between the substrate and the lower semiconductor chip,
wherein the narrow dam includes a linear segment adjacent to a first side surface of the lower semiconductor chip,
wherein the wide dam includes a linear segment adjacent to the first side surface of the lower semiconductor chip,
wherein at least one of the bonding pads includes a first surface adjacent to the first side surface of the lower semiconductor chip and a second surface opposite to the first surface, and
wherein the linear segment of the wide dam is farther from the first side surface of the lower semiconductor chip than the first surface of the at least one of the bonding pads.

2. The semiconductor package according to claim 1, wherein a distance between the lower semiconductor chip and the wide dam is greater than a distance between the lower semiconductor chip and the narrow dam.

3. The semiconductor package according to claim 1, wherein a distance between the lower semiconductor chip and the narrow dam is smaller than a distance between the lower semiconductor chip and each of the bonding pads.

4. The semiconductor package according to claim 1, wherein:
the lower semiconductor chip is electrically connected to the substrate through bumps; and
the upper semiconductor chip is electrically connected to the substrate through bonding wires.

5. The semiconductor package according to claim 1, wherein, when viewed in a plan view:
the narrow dam surrounds the first side surface and second and third side surfaces of the lower semiconductor chip;
the wide dam surrounds the first and third surfaces of the lower semiconductor chip and a fourth surface of the lower semiconductor chip;

the dam structure further includes a first connector connecting a first end of the narrow dam and a first end of the wide dam; and
the dam structure further includes a second connector connecting a second end of the narrow dam and a second end of the wide dam.

6. The semiconductor package according to claim 5, wherein a distance between each of the first and second connectors and a bonding pad disposed adjacent thereto is 50 to 150 μm.

7. The semiconductor package according to claim 5, wherein the bonding pads are disposed to face corresponding ones of the first to third side surfaces of the lower semiconductor chip.

8. The semiconductor package according to claim 1, wherein a distance between the narrow dam and each of the bonding pads is 50 to 150 μm.

9. The semiconductor package according to claim 1, wherein a distance between the wide dam and each adjacent side surface of the substrate is 100 to 300 μm.

10. The semiconductor package according to claim 1, wherein a distance between the lower semiconductor chip and the narrow dam is 200 to 400 μm.

11. The semiconductor package according to claim 1, wherein a distance between the lower semiconductor chip and the wide dam is 500 to 1,000 μm.

12. The semiconductor package according to claim 1, wherein the dam structure has a height of 18 μm or less.

13. The semiconductor package according to claim 1, further comprising:
an alignment mark disposed on the substrate,
wherein the dam structure includes a cut-out bent at a right angle to face the alignment mark.

14. The semiconductor package according to claim 1, wherein:
the at least one upper semiconductor chip includes a first upper semiconductor chip and a second upper semiconductor chip; and
the narrow dam includes a first narrow dam disposed between the first upper semiconductor chip and first bonding pads of the bonding pads, and a second narrow dam disposed between the second upper semiconductor chip and second bonding pads of the bonding pads, and the wide dam is disposed between the first narrow dam and the second narrow dam.

15. A semiconductor package comprising:
a substrate having bonding pads at an upper surface thereof;
a lower semiconductor chip mounted on the substrate by flip-chip bonding and an upper semiconductor chip mounted on the lower semiconductor chip by wire bonding, the upper semiconductor chip attached to an adhesive in contact with an upper surface of the lower semiconductor chip;
an external connection terminal disposed below the substrate;
a dam structure disposed on the substrate and having a single closed loop shape surrounding the lower semiconductor chip, the dam structure including narrow and wide dams connected to one another to form the single closed loop shape, the narrow dam being disposed between the lower semiconductor chip and the bonding pads, and the wide dam having a greater inner width than the narrow dam;
an underfill disposed inside the dam structure and being filled between the substrate and the lower semiconductor chip; and an encapsulant covering the substrate, the lower semiconductor chip, and the upper semiconductor chip, wherein the narrow dam includes a linear segment adjacent to a first side surface of the lower semiconductor chip, wherein the wide dam includes a linear segment adjacent to the first side surface of the lower semiconductor chip, wherein at least one of the bonding pads includes a first surface adjacent to the first side surface of the lower semiconductor chip and a second surface opposite to the first surface, and wherein the linear segment of the wide dam is farther from the first side surface of the lower semiconductor chip than the first surface of the at least one of the bonding pads.

16. A semiconductor package comprising:

a substrate having bonding pads at an upper surface thereof;

a lower semiconductor chip mounted on the substrate by flip-chip bonding and an upper semiconductor chip mounted on the lower semiconductor chip by wire bonding;

an external connection terminal disposed below the substrate;

a dam structure disposed on the substrate and having a closed loop shape surrounding the lower semiconductor chip, the dam structure including narrow and wide dams, the narrow dam being disposed between the lower semiconductor chip and the bonding pads;

an underfill disposed inside the dam structure and being filled between the substrate and the lower semiconductor chip; and an encapsulant covering the substrate, the lower semiconductor chip, and the upper semiconductor chip, wherein the underfill directly contacts inner surfaces of the narrow and wide dams, wherein the narrow dam includes a first linear segment adjacent to a first side surface of the lower semiconductor chip, a second linear segment adjacent to a second side surface of the lower semiconductor chip, and a third linear segment adjacent to a third side surface of the lower semiconductor chip, wherein the wide dam includes a first linear segment adjacent to the first side surface of the lower semiconductor chip, a second linear segment adjacent to a fourth side surface of the lower semiconductor chip, and a third linear segment adjacent to the third side surface of the lower semiconductor chip, wherein the second linear segment of the narrow dam is a single continuous line segment having a length that is greater than a length of the second side surface of the lower semiconductor chip, wherein the second linear segment of the wide dam is a single continuous line segment having a length that is greater than a length of the fourth side surface of the lower semiconductor chip, and wherein a distance between the first linear segment of the narrow dam and the first side surface of the lower semiconductor chip is less than a distance between the first linear segment of the wide dam and the first side surface of the lower semiconductor chip.

17. The semiconductor package of claim 16, wherein a distance between the third linear segment of the narrow dam and the third side surface of the lower semiconductor chip is less than a distance between the third linear segment of the wide dam and the third side surface of the lower semiconductor chip.

18. The semiconductor package of claim 16, wherein a distance between the second linear segment of the narrow dam and the second side surface of the lower semiconductor chip is less than a distance between the second linear segment of the wide dam and the fourth side surface of the lower semiconductor chip.

19. The semiconductor package of claim 16, wherein the narrow and wide dams are connected to one another.

* * * * *